US 9,341,899 B2

(12) United States Patent
Kim et al.

(10) Patent No.: US 9,341,899 B2
(45) Date of Patent: May 17, 2016

(54) LIQUID CRYSTAL DISPLAY

(71) Applicant: Samsung Display Co., Ltd., Yongin, Gyeonggi-Do (KR)

(72) Inventors: Mi Suk Kim, Cheonan-si (KR); Chang-Hun Lee, Hwaseong-si (KR); Tae Ho Kim, Asan-si (KR); Si Heun Kim, Asan-si (KR); So Youn Park, Hwaseong-si (KR); Keun Chan Oh, Cheonan-si (KR); Daisuke Inoue, Cheonan-si (KR)

(73) Assignee: SAMSUNG DISPLAY CO., LTD. (KR)

( * ) Notice: Subject to any disclaimer, the term of this patent is extended or adjusted under 35 U.S.C. 154(b) by 60 days.

(21) Appl. No.: 14/492,498

(22) Filed: Sep. 22, 2014

(65) Prior Publication Data

US 2015/0085233 A1    Mar. 26, 2015

(30) Foreign Application Priority Data

Sep. 24, 2013  (KR) .......................... 10-2013-0113513

(51) Int. Cl.
*G02F 1/1343* (2006.01)
*G02F 1/1337* (2006.01)
*H01L 29/786* (2006.01)
*G02F 1/1335* (2006.01)

(52) U.S. Cl.
CPC .... *G02F 1/134336* (2013.01); *G02F 1/134363* (2013.01); *H01L 29/786* (2013.01); *G02F 1/133512* (2013.01); *G02F 2001/134372* (2013.01)

(58) Field of Classification Search
CPC .. G02B 27/2214; G02B 27/225; G02B 27/22; G02F 1/133526
See application file for complete search history.

(56) References Cited

U.S. PATENT DOCUMENTS

| 6,680,772 | B2 | 1/2004 | Lee | |
|---|---|---|---|---|
| 7,623,191 | B2 | 11/2009 | Liao et al. | |
| 7,683,998 | B2 | 3/2010 | Lee | |
| 8,427,617 | B2 | 4/2013 | Tanaka et al. | |
| 2014/0160395 | A1* | 6/2014 | Park | G02B 27/2214 349/61 |
| 2014/0362322 | A1* | 12/2014 | Park | G02F 1/136286 349/46 |
| 2015/0061986 | A1* | 3/2015 | Song | G02F 1/134363 345/90 |

FOREIGN PATENT DOCUMENTS

| KR | 1020100021734 A | 2/2010 |
|---|---|---|
| KR | 1020120076936 A | 7/2012 |
| KR | 101192754 B1 | 10/2012 |

* cited by examiner

*Primary Examiner* — Tracie Y Green
(74) *Attorney, Agent, or Firm* — Cantor Colburn LLP

(57) ABSTRACT

A liquid crystal display includes: a first substrate; a gate line and a data line disposed on the first substrate; a passivation layer disposed on the gate line and the data line; a first electrode and a second electrode disposed on the passivation layer; and a first insulating layer interposed between the first and second electrodes, where the first and second electrodes overlap each other via the first insulating layer, the second electrode includes a plurality of branch electrodes, and an end portion of the plurality of branch electrodes includes a first side portion and a second side portion extending parallel to the data line, and an oblique portion which connects the first side portion and the second side portion to each other and forms a first angle of less than 90 degrees with an extending line of the first side portion.

14 Claims, 14 Drawing Sheets

(a)

(b)

(c)

(a)

(b)

(c)

(a)

(b)

(c)

(a)

(b)

(c)

(a)

(b)

(c)

(a)

(b)

(c)

LIQUID CRYSTAL DISPLAY

This application claims priority to Korean Patent Application No. 10-2013-0113513 filed on Sep. 24, 2013, and all the benefits accruing therefrom under 35 U.S.C. §119, the contents of which are incorporated by reference herein in its entirety.

BACKGROUND (a) Field

Exemplary embodiments of the invention relate to a liquid crystal display.

(b) Description of the Related Art

A liquid crystal display ("LCD"), which is one of the most widely used types of flat panel display, rearranges liquid crystal molecules of a liquid crystal layer by applying a voltage to electrodes, thereby adjusting an amount of transmitted light.

A method for increasing transmittance and implementing a wide viewing angle of a liquid crystal display, in which a pixel electrode and a common electrode are disposed on a substrate, has received attention.

In the liquid crystal display, where the pixel electrode and the common electrode are disposed in a same substrate, at least one of the pixel electrode and the common electrode may have a plurality of branch electrodes. In such a liquid crystal display, by an influence of a fringe field generated in different directions on an end portion of the branch electrode, an irregular arrangement of liquid crystal molecules may occur on the end portion of the branch electrode, and the irregular arrangements of liquid crystal molecules may be moved according to a center of the pixel area according to the branch electrode. Accordingly, by the irregular arrangement of the liquid crystal molecules, the liquid crystal display has display deterioration.

SUMMARY

Exemplary embodiments of the invention provide a liquid crystal display, in which display quality deterioration due to an irregular arrangement of liquid crystal molecules is effectively prevented while increasing transmittance and realizing a wide viewing angle.

An exemplary embodiment of a liquid crystal display, according to the invention, includes: a first substrate; a gate line disposed on the first substrate; a data line disposed on the first substrate; a passivation layer disposed on the gate line and the data line; and a first electrode disposed on the passivation layer; a second electrode disposed on the passivation layer; a first insulating layer interposed between the first and second electrodes, where the first and second electrodes overlap each other via the first insulating layer interposed therebetween, the second electrode includes a plurality of branch electrodes, and an end portion of branch electrodes includes a first side portion substantially parallel to the data line, a second side portion extending substantially parallel to the data line and opposite to the first side portion, and an oblique portion which connects the first side portion and the second side portion to each other and forms a first angle, which is less than 90 degrees, with an extending line of the first side portion.

In an exemplary embodiment, the end portion of the branch electrode may further include a curved portion between the first side portion and the second side portion.

In an exemplary embodiment, the first angle may be less than about 70 degrees.

In an exemplary embodiment, the liquid crystal display may further include a light blocking member disposed to surround the branch electrodes, and the first angle may satisfy the following inequation:

$$90 - \tan^{-1}\left(\frac{b}{a}\right) \le \theta \le 70°,$$

where, 'a' denotes a width of the branch electrode, and 'b' denotes a maximum interval between an end of the first side portion of the branch electrode and a portion of the light blocking member adjacent thereto.

In an exemplary embodiment, the first electrode may have a planar shape of a plate type, and the branch electrodes of the second electrode may overlap the first electrode.

In an exemplary embodiment, the liquid crystal display may further include: a second substrate disposed opposite to the first substrate; a first alignment layer disposed on the first substrate; a second alignment layer disposed on the second substrate; and a liquid crystal layer disposed between the first substrate and the second substrate and including a plurality of liquid crystal molecules, where the liquid crystal molecules have positive dielectric anisotropy or negative dielectric anisotropy, and the first alignment layer and the second alignment layer are aligned in a predetermined direction such that liquid crystal molecules adjacent to the first alignment layer and the second alignment layer have a pretilt in a direction forming a second angle with the gate line or an angle acquired by subtracting the second angle from 90 degrees with the gate line.

In an exemplary embodiment, an angle between the oblique portion of the branch electrode and a pretilt direction may have a value of a sum of the first angle and the second angle or a value acquired by subtracting the sum of the first angle and the second angle from 90 degrees.

According to exemplary embodiments of the liquid crystal display, the display quality deterioration by the irregular movement of the liquid crystal molecules may be effectively prevented while increasing the transmittance of the liquid crystal display and realizing the wide viewing angle.

BRIEF DESCRIPTION OF THE DRAWINGS

The above and other features of the invention will become more apparent by describing in detail exemplary embodiments thereof with reference to the accompanying drawings, in which.

DETAILED DESCRIPTION

Figure 1:
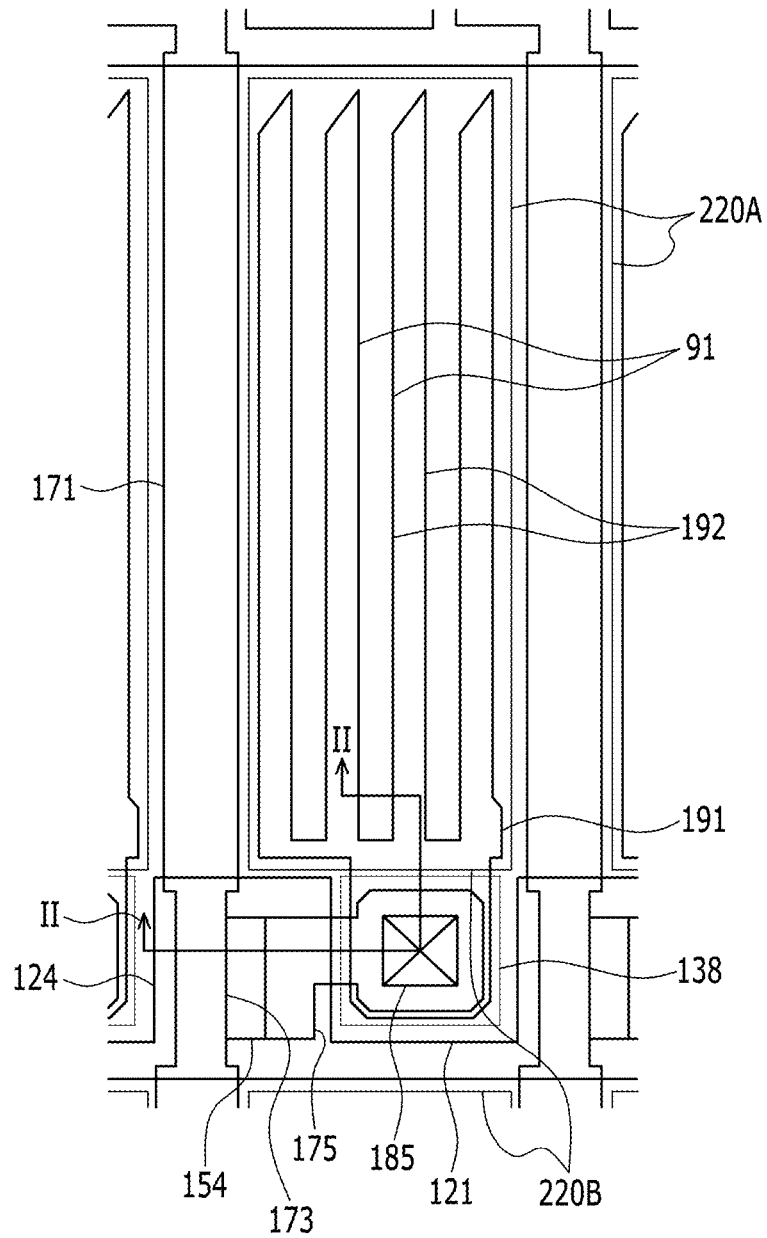
FIG. 1 is a plan view of an exemplary embodiment of a liquid crystal display, according to the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, exemplary embodiments of a liquid crystal display, according to the invention, will be described in detail with reference to accompanying drawings.

An exemplary embodiment of a liquid crystal display, according to the invention, will now be described with reference to FIG. 1 and FIG. 2. FIG. 1 is a plan view of an exemplary embodiment of a liquid crystal display, according to the invention, and FIG. 2 is a cross-sectional view taken along the line II-II of the liquid crystal display of FIG. 1.

Figure 2:
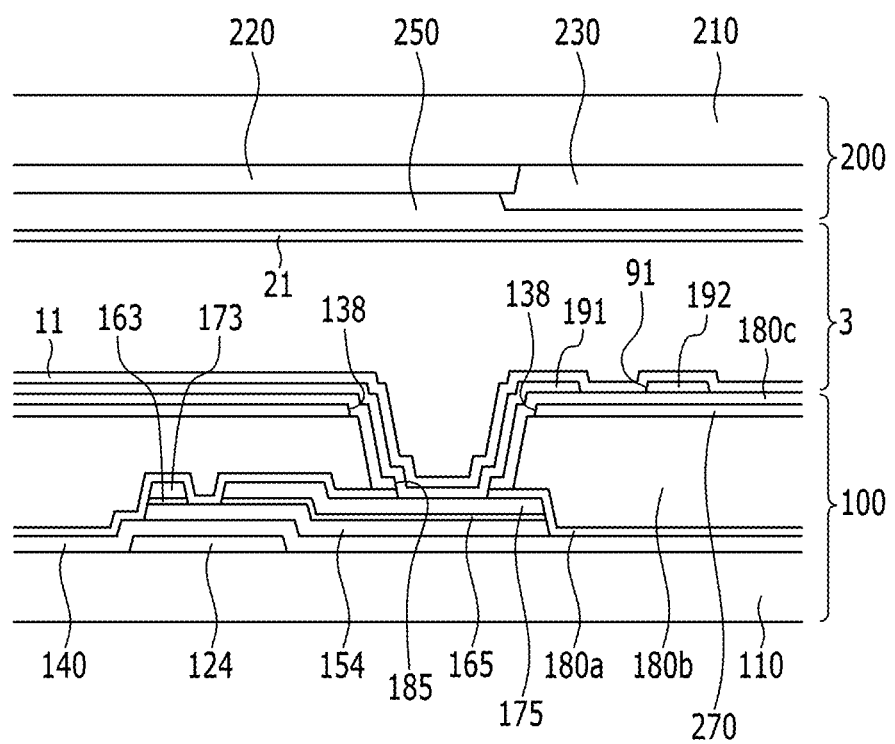
FIG. 2 is a cross-sectional view taken along the line II-II of the liquid crystal display of FIG. 1.

Referring to FIG. 1 and FIG. 2, an exemplary embodiment of a liquid crystal display includes a lower panel 100, an upper panel 200, and a liquid crystal layer 3 interposed between the lower and upper panels 100 and 200.

Firstly, the lower panel 100 will be described.

In the lower panel 100, a gate line 121 that includes a gate electrode 124 and an end portion (not shown) for connection with another layer or an external driving circuit is disposed on a first substrate 110. The gate line 121 may include or be made of aluminum (Al) or an aluminum-based metal such as an aluminum alloy, silver (Ag) or a silver-based metal such as a silver alloy, copper (Cu) or a copper-based metal such as a copper alloy, molybdenum (Mo) or a molybdenum-based metal such as a molybdenum alloy, chromium (Cr), tantalum (Ta), or titanium (Ti), for example. In such an embodiment, the gate line 121 may have a multilayer structure including at least two conductive layers having different physical properties.

A gate insulating layer 140 including a silicon nitride (SiNx) or a silicon oxide (SiOx) is disposed on the gate line 121. The gate insulating layer 140 may have a multilayer structure including at least two insulating layers having different physical properties.

A semiconductor layer 154 including amorphous silicon or polysilicon is disposed on the gate insulating layer 140. The semiconductor layer 154 may include an oxide semiconductor.

Ohmic contacts 163 and 165 are disposed on the semiconductor 154. The ohmic contacts 163 and 165 may include or be made of a material such as n+ hydrogenated amorphous silicon, on which an n-type impurity such as phosphorus is doped at a high concentration, or a silicide, for example. The ohmic contacts 163 and 165 may be disposed as a pair on the semiconductor 154. In an exemplary embodiment, where the semiconductor layer 154 is an oxide semiconductor, the ohmic contacts 163 and 165 may be omitted.

A data conductor, including a data line 171 including a source electrode 173 and a drain electrode 175, is disposed on the ohmic contacts 163 and 165 and the gate insulating layer 140.

The data line 171 includes the source electrode 173 and a wide end portion (not illustrated) for connection with another layer or an external driving circuit. The data line 171 transfers a data signal and extends substantially in a vertical direction to cross the gate line 121.

The source electrode 173 corresponds to a part of the data line 171 and is disposed in the same line as the data line 171. The drain electrode 175 extends substantially parallel to the source electrode 173. In such an embodiment, the drain electrode 175 may be substantially parallel to a part of the data line 171.

The gate electrode 124, the source electrode 173 and the drain electrode 175 collectively define a thin film transistor together with the semiconductor 154, and a channel of the thin film transistor is formed in the semiconductor 154 between the source electrode 173 and the drain electrode 175.

In an exemplary embodiment, the liquid crystal display includes the source electrode 173 disposed in the same line as the data line 171 and the drain electrode 175 extending substantially parallel to the data line 171 such that the width of the thin film transistor may be widened without increasing an area of the data conductor, thereby increasing an aperture ratio of the liquid crystal display.

The data line 171 and the drain electrode 175 may include or be made of a refractory metal such as molybdenum, chromium, tantalum, and titanium, or an alloy thereof, and may have a multilayer structure including a refractory metal layer (not illustrated) and a low resistance conductive layer (not illustrated). In an exemplary embodiment, the multilayer structure of the data line 171 and the drain electrode 175 may include a double layer including a chromium or molybdenum (alloy) lower layer and an aluminum (alloy) upper layer, or a triple layer including a molybdenum (alloy) lower layer, an aluminum (alloy) intermediate layer, and a molybdenum (alloy) upper layer.

A first passivation layer 180a is disposed on the data conductors 171, 173 and 175, the gate insulating layer 140 and the exposed portion of the semiconductor 154. The first passivation layer 180a may include or be made of an organic insulating material or an inorganic insulating material.

A second passivation layer 180b is disposed on the first passivation layer 180a. The second passivation layer 180b may include or be made of an organic insulator.

In an alternative exemplary embodiment, the second passivation layer 180b may function as a color filter. In such an embodiment, where the second passivation layer 180b is the color filter, the second passivation layer 180b may display one of primary colors, e.g., three primary colors such as red, green and blue, or yellow, cyan and magenta. In such an embodiment, the color filter may further include additional color filter for displaying a mixed color of the primary colors or white other than the primary colors.

A common electrode 270 is disposed on the second passivation layer 180b.

The common electrode 270 is also referred to as a first field generating electrode. The common electrode 270 has a planar shape, may be disposed on substantially an entire surface of the first substrate 110 as a plate, and an opening 138 may be defined in the common electrode 270 at the region corresponding to the periphery of the drain electrode 175. That is, the common electrode 270 may have the planar shape of a plate type.

Common electrodes 270 disposed on adjacent pixels are connected to each other to receive a common voltage of a predetermined level supplied from outside of the display area.

A third passivation layer 180c is disposed on the common electrode 270. The third insulating layer 180c may include or be formed of the organic insulating material or the inorganic insulating material.

A pixel electrode 191 is disposed on the third passivation layer 180c. The pixel electrode 191 includes a plurality of branch electrodes 192 defined by a plurality of cutouts 91. The branch electrodes 192 of the pixel electrode 191 overlap the common electrode 270.

In an exemplary embodiment, an end portion of the branch electrodes 192 of the pixel electrode 191 includes two side portions extending in a direction substantially parallel to the data line 171 and an oblique portion that connects the two stems and extends in a direction at a first angle ($\theta$) (see FIG. 3) with an extending direction of the two side portions. A shape of the end portion of a plurality of branch electrodes 192 of the pixel electrode 191 will be described in detail later.

In such an embodiment, a first contact hole 185 that exposes the drain electrode 175 may be defined through the first passivation layer 180a, the second passivation layer 180b and the third passivation layer 180c. The pixel electrode 191 is physically and electrically connected with the drain electrode 175 through the first contact hole 185 to receive a voltage from the drain electrode 175.

A first alignment layer 11 is disposed on the pixel electrode 191 and the third passivation layer 180c. The first alignment layer 11 may be aligned in a predetermined direction. The first alignment layer 11 may be a photo-alignment layer.

Next, the upper panel 200 will be described.

In the upper panel 200, a light blocking member 220 is disposed on a second substrate 210 including transparent glass or plastic. The light blocking member 220 may be referred to as a black matrix that effectively prevents light leakage.

The light blocking member 220 includes a first portion 220A extending substantially parallel the data line 171 and extending in a column direction between two adjacent pixels columns, and a second portion 220B extending between two adjacent pixel rows in the row direction. A plurality of color filters 230 is disposed on the substrate 210. In an exemplary embodiment, where the second passivation layer 180b of the lower panel 100 is a color filter, the color filters 230 of the upper panel 200 may be omitted. In such an embodiment, the light blocking member 220 of the upper panel 200 may be disposed in the lower panel 100.

An overcoat 250 is disposed on the color filter 230 and the light blocking member 220. The overcoat 250 may include or be made of an organic insulator, and effectively prevents the color filter 230 from being exposed to outside and provides a flat surface. In an alternative exemplary embodiment, the overcoat 250 may be omitted.

A second alignment layer 21 is disposed on the overcoat 250. The second alignment layer 21 is aligned in a predetermined direction. The second alignment layer 21 may be a photo-alignment layer.

The liquid crystal layer 3 includes a liquid crystal material having positive dielectric anisotropy or negative dielectric anisotropy.

Liquid crystal molecules of the liquid crystal layer 3 are aligned in a predetermined direction such that directions of longitudinal axes thereof are arranged substantially parallel to the display panels, e.g., the lower and upper panels 100 and 200.

In an exemplary embodiment, where the liquid crystal layer 3 has the negative dielectric anisotropy, the liquid crystal molecules are aligned to have a pretilt in a direction forming a second angle (δ) with the extending direction of the gate line 121. In an exemplary embodiment, where the liquid crystal layer 3 has the positive dielectric anisotropy, the liquid crystal molecules are aligned to have the pretilt in a direction forming the second angle (δ) with a direction substantially perpendicular to the gate line 121. That is, when the liquid crystal layer 3 has the positive dielectric anisotropy, the liquid crystal molecules are aligned to have the pretilt in the direction forming an angle acquired by subtracting the second angle (δ) from 90 degrees with the gate line 121. Here, the, second angle (δ) may be in a range from about 5 degrees to about 10 degrees.

The pixel electrode 191 is applied with a data voltage from the drain electrode 175, and the common electrode 270 is applied with a common voltage of a predetermined level from a common voltage application unit disposed outside the display area.

The pixel electrode 191 and the common electrode 270, which are field generating electrodes, generate an electrical field such that the liquid crystal molecules of the liquid crystal layer 3 disposed thereon are rotated in a direction parallel to the direction of the electric field. As described above, the polarization of light passing through the liquid crystal layer is changed based on the determined rotation direction of the liquid crystal molecules.

As described above, in such an embodiment, the two field generating electrodes 191 and 270 are disposed on a same display panel, e.g., the lower panel 100, transmittance of the liquid crystal display is increased and a wide viewing angle may be realized.

According to an exemplary embodiment of the liquid crystal display, the common electrode 270 has the planar shape and the pixel electrode 191 has a plurality of branch electrodes, but not being limited thereto. In an alternative exemplary embodiment, the pixel electrode 191 may have a planar shape and the common electrode 270 may have a plurality of branch electrodes.

In an exemplary embodiment of the invention, where two field generating electrodes overlap via the insulating layer on the first substrate 110, the first field generating electrode under the insulating layer may have the planar shape, and the second field generating electrode on the insulating layer may have a plurality of branch electrodes.

Figure 3:
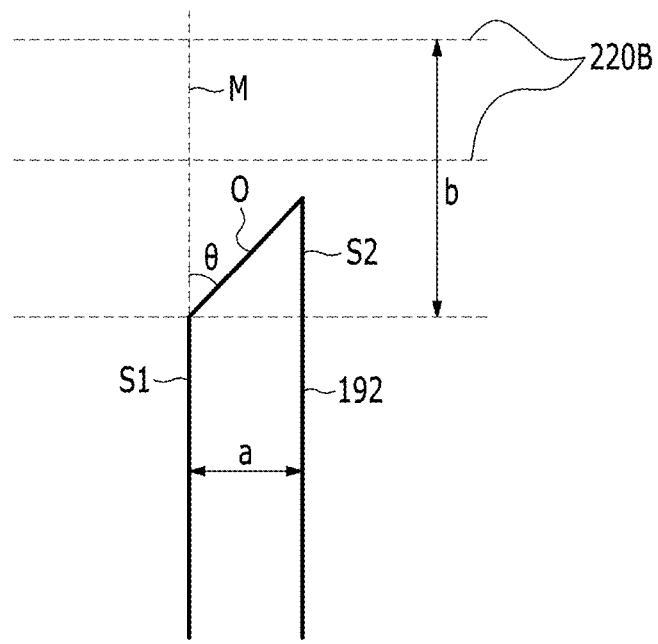
FIG. 3 is a partial plan view of an exemplary embodiment of a branch electrode of a liquid crystal display, according to the invention.
Figure 4:
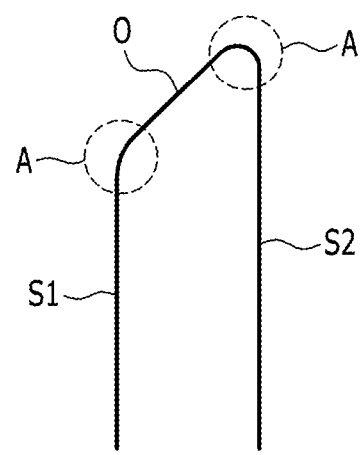
FIG. 4 is a partial plan view of an alternative exemplary embodiment of a branch electrode of a liquid crystal display, according to the invention.

Next, the branch electrodes of an exemplary embodiment of the liquid crystal display, according to the invention will be described with reference to FIG. 3 and FIG. 4. FIG. 3 is a partial plan view of an exemplary embodiment of a branch electrode of a liquid crystal display, according to the invention, and FIG. 4 is a partial plan view of an alternative exemplary embodiment of a branch electrode of a liquid crystal display, according to the invention.

As described above, one of the first field generating electrode and the second field generating electrode of an exemplary embodiment of the liquid crystal display, according to the invention, includes a plurality of branch electrodes. Now, one branch electrode of the first field generating electrode and the second field generating electrode will be described in detail.

Referring to FIG. 3, the branch electrode 192 of the pixel electrode 191 includes a first side portion S1 and a second side portion S2 extending substantially parallel to the extending direction of the data line 171, and an oblique portion O that connects the first side portion S1 and the second side portion S2 and forms a predetermined angle with the first side portion S1 and the second side portion S2.

The first side portion S1 and the second side portion S2 may extend substantially parallel to each other.

In such an embodiment, the first side portion S1 and the second side portion S2 may include a portion that is not parallel to the extending direction thereof.

At least a portion of the oblique portion O of the branch electrode 192 of the pixel electrode 191 may overlap the second portion 220B of the light blocking member 220.

A first angle (θ) between an extending line M of the first side portion S1 of the branch electrode 192, which is an imaginary line that extends from the side portion S1 along the extending direction thereof, and the oblique portion O may be less than about 90 degrees. In one exemplary embodiment, for example, the first angle (θ) may be less than about 70 degrees.

In such an embodiment, the first angle (θ) between the extending line M of the first side portion S1 of the branch electrode 192 and the oblique portion O may satisfy the following inequation:

$$90 - \tan^{-1}\left(\frac{b}{a}\right) \le \theta \le 70°.$$

In the inequation above, 'a' denotes a width of the branch electrode 192, and 'b' denotes a maximum interval between an end portion of the first side portion S1 of the branch electrode 192 and the light blocking member 220B adjacent thereto. Here, the width may be defined as a length of the branch electrode in a direction substantially perpendicular to the extending direction thereof.

In an exemplary embodiment, where the liquid crystal layer 3 has the positive dielectric anisotropy, the angle between a pretilt direction of the liquid crystal molecules and the oblique portion O is a value of a sum of the first angle (θ) and the second angle (δ). In an exemplary embodiment, where the liquid crystal layer 3 has the negative dielectric anisotropy, the angle between the pretilt direction of the liquid crystal molecule and the oblique portion O is a value acquired by subtracting the sum of the first angle (θ) and the second angle (δ) from 90 degrees. Here, the second angle (δ) may be in a range from about 5 degrees to about 10 degrees.

Referring to FIG. 4, an alternative exemplary embodiment of the branch electrode 192 has a similar shape as the exemplary embodiment of the branch electrode 192 shown in FIG. 3.

In such an embodiment, the branch electrode 192 includes a first side portion S1 and a second side portion S2 extending substantially parallel to the extending direction of the data line 171, and an oblique portion O that connects the first side portion S1 and the second side portion S2 and forms a predetermined angle along with the first side portion S1 and the second side portion S2.

The first side portion S1 and the second side portion S2 may extend substantially parallel to each other.

However, the first side portion S1 and the second side portion S2 may include a portion that is not parallel to the extending direction thereof.

At least a portion of the oblique portion O of the branch electrode 192 may overlap the second portion 220B of the light blocking member 220. In such an embodiment, the light blocking member 220 may be disposed to surround the branch electrodes 192 of the pixel electrode 191 when viewed from a top plan view.

The first angle (θ) between an extending line M of the first side portion S1 of the branch electrode 192 and the oblique portion O may be less than about 90 degrees. In one exemplary embodiment, for example, the first angle (θ) may be less than about 70 degrees.

In an exemplary embodiment, the first angle (θ) between the extending line M of the first side portion S1 of the branch electrode 192 and the oblique portion O may satisfy the following inequation.

$$90 - \tan^{-1}\left(\frac{b}{a}\right) \le \theta \le 70°.$$

In the inequation above, 'a' denotes a width of the branch electrode 192, and 'b' denotes a maximum interval between an end portion of the first side portion S1 of the branch electrode 192 and the light blocking member 220B adjacent thereto.

In an exemplary embodiment, where the liquid crystal layer 3 has the positive dielectric anisotropy, the angle between the pretilt direction of the liquid crystal molecules and the oblique portion O is a value of a sum of the first angle (θ) and the second angle (δ). In an exemplary embodiment, where the liquid crystal layer 3 has the negative dielectric anisotropy, the angle between the pretilt direction of the liquid crystal molecule and the oblique portion O is a value acquired by subtracting the sum of the first angle (θ) and the second angle (δ) from 90 degrees. Here, the second angle (δ) may be in a range from about 5 degrees to about 10 degrees.

However, in such an embodiment of the branch electrode 192 of the liquid crystal display, a curved portion A is defined between the first side portion S1 and the oblique portion O and between the second side portion S2 and the oblique portion O.

Figure 5:
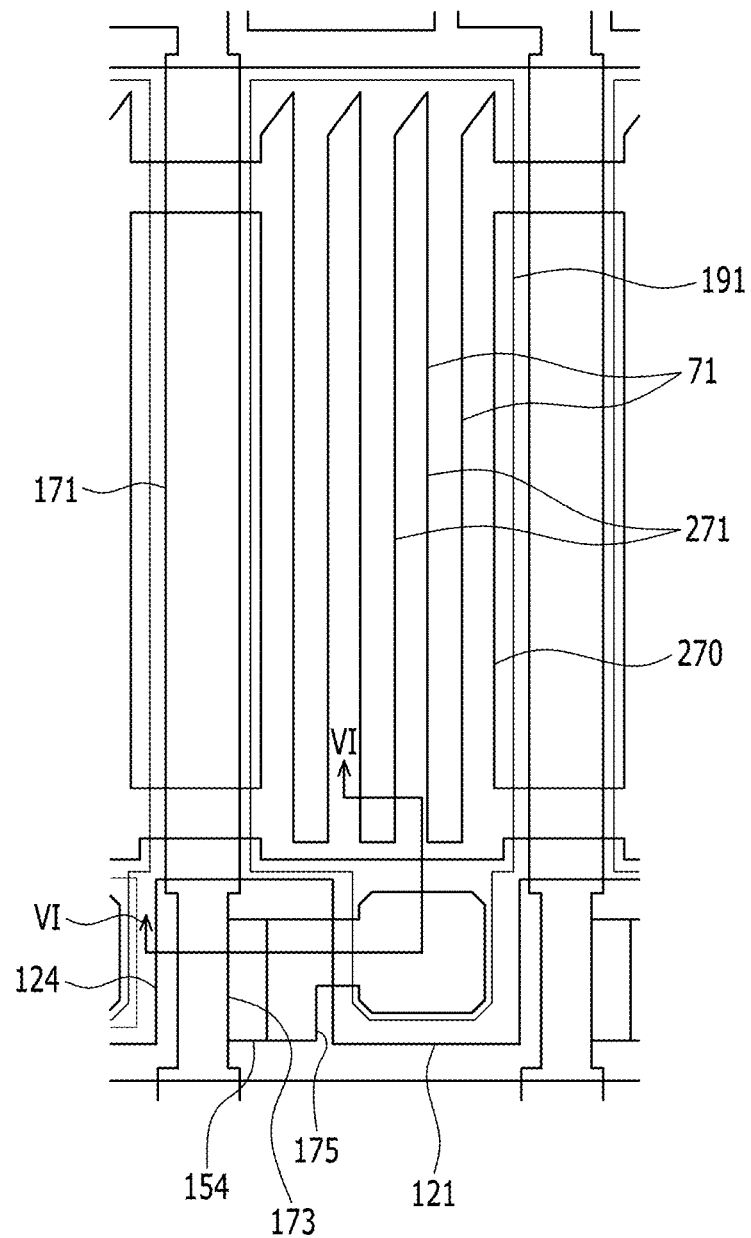
FIG. 5 is a plan view of an alternative exemplary embodiment of a liquid crystal display, according to the invention.

Next, an alternative exemplary embodiment of a liquid crystal display, according to the invention, will be described with reference to FIG. 5 and FIG. 6. FIG. 5 is a plan view of an alternative exemplary embodiment of a liquid crystal display, according to the invention, and FIG. 6 is a cross-sectional view taken along the line VI-VI of the liquid crystal display of FIG. 5.

Figure 6:
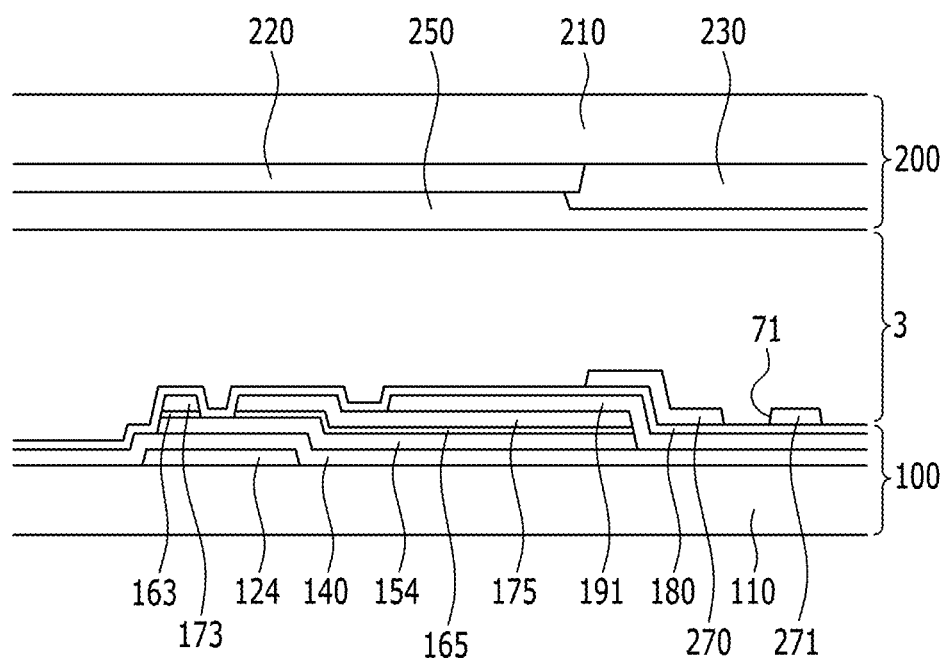
FIG. 6 is a cross-sectional view taken along the line VI-VI of the liquid crystal display of FIG. 5.

Referring to FIG. 5 and FIG. 6, an alternative exemplary embodiment of the liquid crystal display is similar to an exemplary embodiment of the liquid crystal display shown in FIG. 1, FIG. 2, FIG. 3 and FIG. 4. The same or like elements shown in FIGS. 5 and 6 have been labeled with the same reference characters as used above to describe the exemplary embodiments of the liquid crystal display shown in FIGS. 1 to 4, and any repetitive detailed description thereof will hereinafter be omitted or simplified.

In such an embodiment, as shown in FIGS. 5 and 6, the liquid crystal display includes the lower panel 100 and the upper panel 200, and the liquid crystal layer 3 interposed between the lower and upper panel 100 and 200.

Firstly, the lower panel 100 will be described.

In the lower panel 100, a gate conductor including the gate line 121 is disposed on the first substrate 110.

The gate insulating layer 140 including a silicon nitride (SiNx) or a silicon oxide (SiOx) is disposed on the gate conductor 121.

The semiconductor 154 is disposed on the gate insulating layer 140.

The ohmic contacts 163 and 165 are disposed on the semiconductor 154. In an exemplary embodiment, where the semiconductor layer 154 includes an oxide semiconductor, the ohmic contacts 163 and 165 may be omitted.

The data conductor including the data line 171 including the source electrode 173 and the drain electrode 175 is disposed on the ohmic contacts 163 and 165 and the gate insulating layer 140.

The pixel electrode 191 may be disposed directly on the drain electrode 175. The pixel electrode 191 has the planer shape, that is, the plate type, and is disposed in a pixel area.

A passivation layer 180 is disposed on the data conductors 171, 173 and 175, the gate insulating layer 140, the exposed portion of the semiconductor 154 and the pixel electrode 191.

The common electrode 270 is disposed on the passivation layer 180. The common electrodes 270 are connected to each other and receive the common voltage from the common voltage application unit disposed outside the display area.

The common electrode 270 includes a plurality of branch electrodes 271 defined by a plurality of cutouts 71.

Ends of the plurality of branch electrodes 271 of the common electrode 270 include two side portions extending in a direction substantially parallel to the data line 171, and an oblique portion connecting the two side portions and forming a first angle (θ) with an extending line of the side portion. The shape of the ends of the branch electrodes 271 of the common electrode 270 is substantially the same as the shape of the branch electrodes 192 shown in FIG. 3 and FIG. 4.

In detail, each branch electrode 271 of the common electrode 270 includes the first side portion S1 and the second side portion S2 extending parallel to the extending direction of the data line 171, and the oblique portion O connecting the first side portion S1 and the second side portion S2 and forming the predetermined angle along with the first side portion S1 and the second side portion S2.

The first side portion S1 and the second side portion S2 may extend substantially parallel to each other.

However, the first side portion S1 and the second side portion S2 may include a portion that is not parallel to an extending direction thereof.

At least a portion of the oblique portion O of the branch electrode 271 of the common electrode 270 may overlap a second portion 220B of a light blocking member 220. In such an embodiment, the light blocking member 220 may be disposed to surround the branch electrodes 271 of the common electrode 270 when viewed from a top plan view.

The first angle (θ) between an extending line M of the first side portion S1 of the branch electrode 192 and the oblique portion O may be less than about 90 degrees. In one exemplary embodiment, for example, the first angle (θ) may be less than about 70 degrees.

In such an embodiment, the first angle (θ) between the extending line M of the first side portion S1 of the branch electrode 192 and the oblique portion O may satisfy the following inequation:

$$90 - \tan^{-1}\left(\frac{b}{a}\right) \le \theta \le 70°.$$

In the inequation above, 'a' denotes the width of the branch electrode 192, and 'b' denotes the maximum interval between an end of the first side portion S1 of the branch electrode 192 and the light blocking member 220B adjacent thereto. Here, an interval between the end of the first side portion S1 of the branch electrode 192 and the light blocking member 220B means a distance in the extending direction of the first side portion S1 between the end of the first side portion S1 of the branch electrode 192, which is adjacent to the light blocking member 220b, and the light blocking member 220B.

In an exemplary embodiment, where the liquid crystal layer 3 has the positive dielectric anisotropy, the angle between the pretilt direction of the liquid crystal molecules and the oblique portion O is a value of a sum of the first angle (θ) and the second angle (δ). In an exemplary embodiment, where the liquid crystal layer 3 has the negative dielectric anisotropy, the angle between the pretilt direction of the liquid crystal molecule and the oblique portion O is a value acquired by subtracting the sum of the first angle (θ) and the second angle (δ) from 90 degrees. Here, the second angle (δ) may be in the range from about 5 degrees to about 10 degrees.

In such an embodiment, the curved portion A may be defined between the first side portion S1 and the oblique portion O and between the second side portion S2 and the oblique portion O.

A first alignment layer (not shown) is disposed on the passivation layer 180 and the common electrode 270.

Next, the upper panel 200 will be described.

In the upper panel 200, the light blocking member 220 is disposed on the second substrate 210. The light blocking member 220 includes the first portion 220A that extends substantially parallel to the data line 171 and extends substantially in the column direction between two adjacent pixels columns, and the second portion 220B that extends between two adjacent pixel rows in the row direction.

A plurality of color filters 230 is disposed on the substrate 210. In an alternative exemplary embodiment, the light blocking member 220 and the color filters 230 may be disposed in the lower panel 100.

The overcoat 250 is disposed on the color filters 230 and the light blocking member 220. In an alternative exemplary embodiment, the overcoat 250 may be omitted.

The second alignment layer (not shown) is disposed on the overcoat 250. The second alignment layer 21 is aligned in the predetermined direction. The second alignment layer 21 may be the photo-alignment layer.

The liquid crystal layer 3 includes the liquid crystal material having the positive dielectric anisotropy or the negative dielectric anisotropy.

The liquid crystal molecules of the liquid crystal layer 3 are aligned in a predetermined direction such that directions of longitudinal axes thereof are arranged substantially parallel to the display panels, e.g., the lower and upper panels 100 and 200.

In an exemplary embodiment, where the liquid crystal layer 3 has the negative dielectric anisotropy, the liquid crystal molecules are aligned to have a pretilt in a direction forming the second angle (δ) with the extending direction of the gate line 121. In an exemplary embodiment, where the liquid crystal layer 3 has the positive dielectric anisotropy, the liquid crystal molecules are aligned to have the pretilt in the direction forming the second angle (δ) with the direction perpendicular to the gate line 121. That is, when the liquid crystal layer 3 has the positive dielectric anisotropy, the liquid crystal molecules are aligned to have the pretilt in the direction forming an angle acquired by subtracting the second angle (δ) from 90 degrees with the gate line 121. Here, the, second angle (δ) may be in a range from about 5 degrees to about 10 degrees.

The pixel electrode 191 is applied with the data voltage from the drain electrode 175, and the common electrode 270 is applied with the common voltage of the predetermined level from a common voltage application unit disposed outside the display area.

The pixel electrode 191 and the common electrode 270, as field generating electrodes, generate an electrical field such that the liquid crystal molecules of the liquid crystal layer 3 disposed thereon are rotated in a direction substantially parallel to the direction of the electric field. As described above, the polarization of light passing through the liquid crystal layer is changed based on the determined rotation direction of the liquid crystal molecules.

As described above, in such an embodiment, where the two field generating electrodes 191 and 270 are disposed in a same display panel, e.g., the lower panel 100, transmittance of the liquid crystal display is increased and a wide viewing angle may be realized.

According to an exemplary embodiment of the liquid crystal display as shown in FIGS. 5 and 6, the common electrode 270 has the planar shape and the pixel electrode 191 has a plurality of branch electrodes, however not being limited thereto. According to an alternative exemplary embodiment of a liquid crystal display, the pixel electrode 191 may have a planar shape and the common electrode 270 may have a plurality of branch electrodes.

In such an embodiment, two field generating electrodes overlap via the insulating layer on the first substrate 110, the first field generating electrode under the insulating layer has the planar shape, and the second field generating electrode on the insulating layer has a plurality of branch electrodes.

Figure 7A:
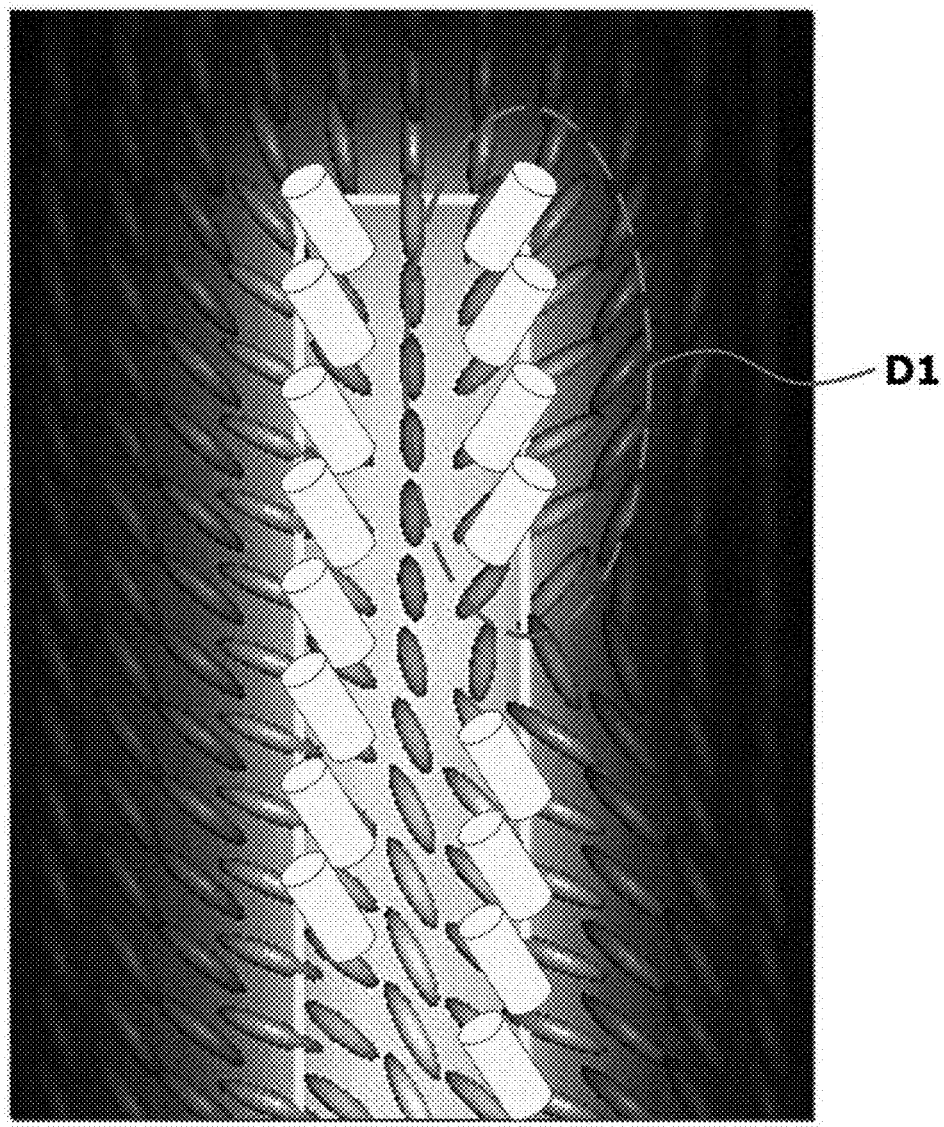
FIG. 7A and FIG. 7B are views showing a result of an experimental example of the invention.
Figure 7B:
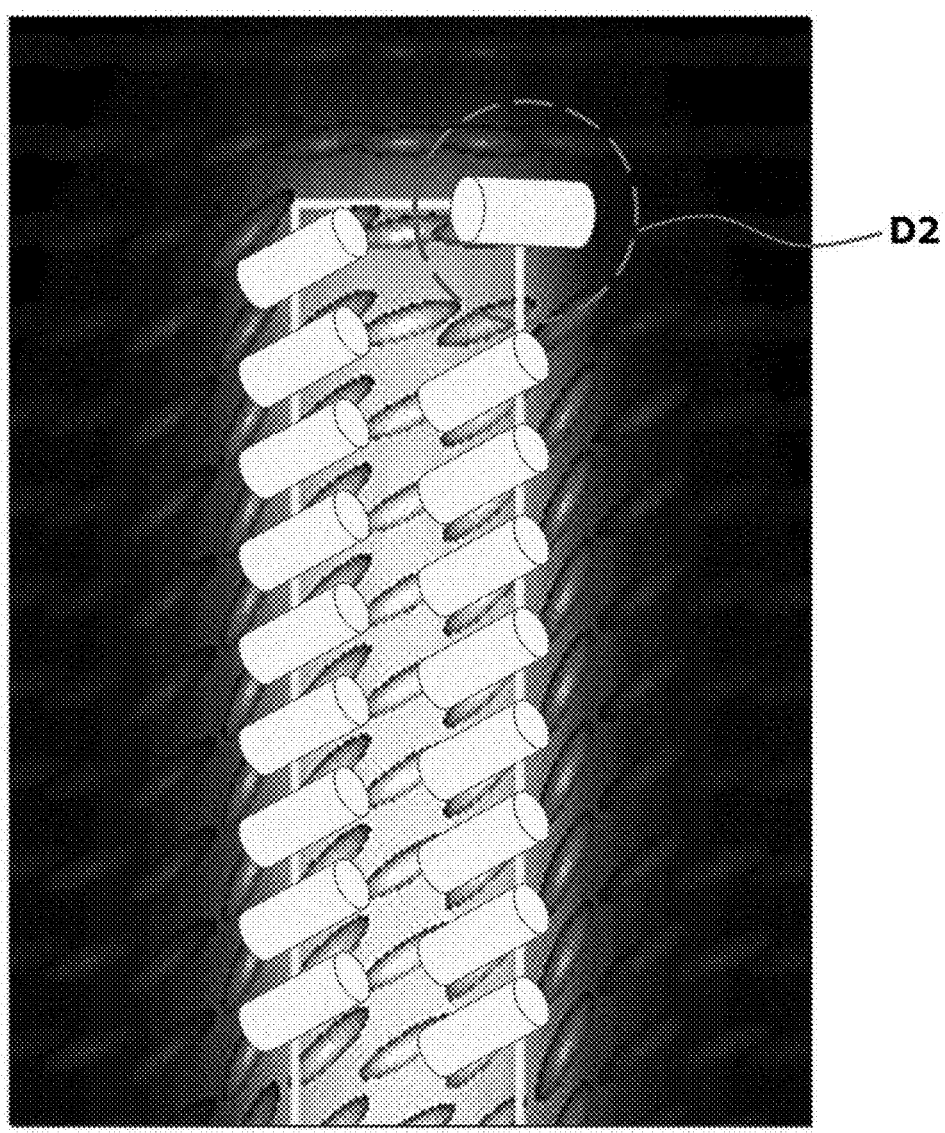

Next, an experimental example of a conventional liquid crystal display will be described with reference to FIG. 7A and FIG. 7B. FIG. 7A and FIG. 7B are views showing a result of an experimental example of the conventional liquid crystal display.

In the experimental example, an arrangement direction of liquid crystal director of a conventional liquid crystal display, where a branch electrode of the field generating electrode includes two side portions and a perpendicular part connecting the two side portions and disposed perpendicular to the two side portions, is measured on the end portion of the branch electrode. FIG. 7A is a case in which the liquid crystal molecules have the positive dielectric anisotropy, and FIG. 7B is a case in which the liquid crystal molecules have the negative dielectric anisotropy.

Referring to FIG. 7A, by the fringe field formed on the edge of the branch electrode, the liquid crystal molecules are inclined toward the pretilt direction, however the director of the liquid crystal molecules corresponding to a first region D1 corresponding to an end portion of the second side portion S2 of the branch electrode is inclined in a different direction from the pretilt direction. Accordingly, due to irregular movement of the liquid crystal molecules disposed corresponding to the first region D1, the display quality may be deteriorated.

Referring to FIG. 7B, by the fringe field formed on the edge of the branch electrode, the liquid crystal molecules are inclined toward the pretilt direction, however the director of the liquid crystal molecules corresponding to a second region D2 corresponding to the end portion of the second side portion S2 of the branch electrode is inclined in a different direction from the pretilt direction. Accordingly, due to the irregular movement of the liquid crystal molecules disposed corresponding to the second region D2, the display quality may be deteriorated.

Next, an experimental example of exemplary embodiments according to the invention will be described with reference to FIG. 8 to FIG. 13. FIG. 8 to FIG. 13 are views showing a result of an experimental example of exemplary embodiments according to the invention.

Figure 8:
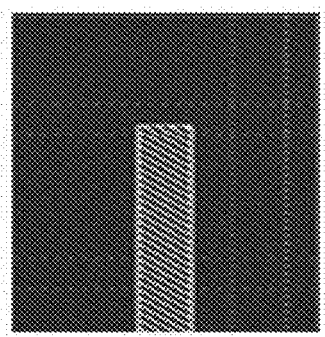
FIG. 8 to FIG. 13 are views showing a result of another experimental example of the invention.
Figure 8:
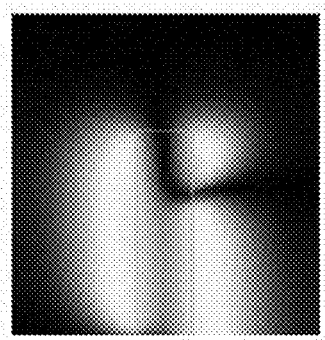
Figure 8:
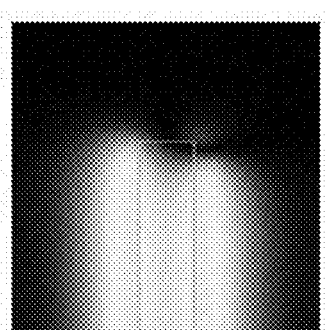

The experimental example of FIG. 8 shows a branch electrode includes the first side portion S1 and the second side portion S2, and a connection portion between the first side portion S1 and the second side portion S2 that is perpendicular to the first side portion S1 and the second side portion S2 like the conventional liquid crystal display, and the experimental example of FIGS. 9 to 13 show branch electrodes, each of which includes the oblique portion O that connects the first side portion S1 and the second side portion S2 and forms the first angle (θ) between the extending line M of the first side portion S1 as in an exemplary embodiment of the liquid crystal display according to the invention described above. In the branch electrodes shown in FIGS. 9 to 13, the first angle (θ) of the oblique portion O is about 80 degrees, about 60 degrees, about 45 degrees, about 30 degrees, and about 10 degrees, respectively. In FIGS. 8 to 13, a transmittance result is measured in the end portion of the branch electrode and a result thereof is shown through an electron micrograph. In FIG. 8 to FIG. 13, image (a) shows a shape of the branch electrode, image (b) shows a case in which the liquid crystal molecules have the positive dielectric anisotropy, and image (c) shows a case in which the liquid crystal molecules have the negative dielectric anisotropy.

FIG. 8 shows the results of the case in which the connection portion between the first side portion S1 and the second side portion S2 is provided to be perpendicular to the first side portion S1 and the second side portion S2 like the conventional liquid crystal display, and FIG. 9 to FIG. 13 show results of cases where the first angle (θ) between the extending line M of the first side portion S1 and the oblique portion O is about 80 degrees, about 60 degrees, about 45 degrees, about 30 degrees and about 10 degrees, respectively.

Firstly, referring to FIG. 8, as in the conventional liquid crystal display, where the connection portion between the first side portion S1 and the second side portion S2 is provided to be perpendicular to the first side portion S1 and the second side portion S2, a region where the transmittance is deteriorated by the irregular movement of the liquid crystal molecules on the end portion of the branch electrode is observed, and an area of the region is substantially wide.

Figure 9:
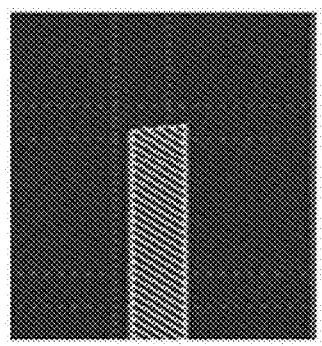
Figure 9:
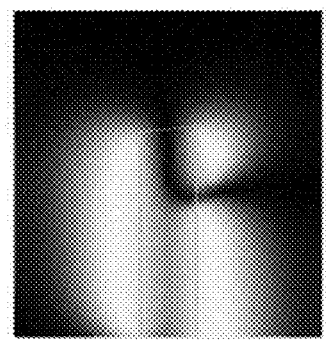
Figure 9:
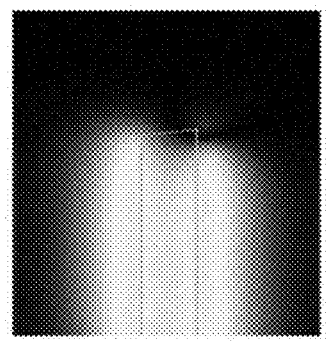
Figure 10:
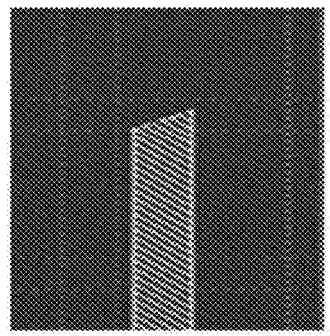
Figure 10:
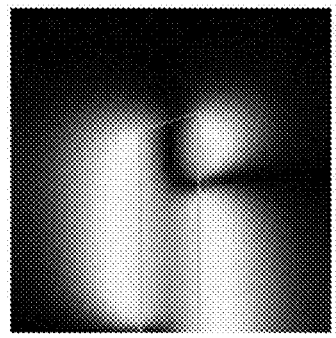
Figure 10:
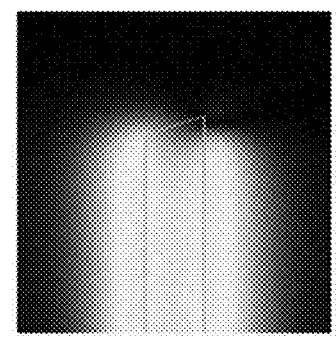
Figure 11:
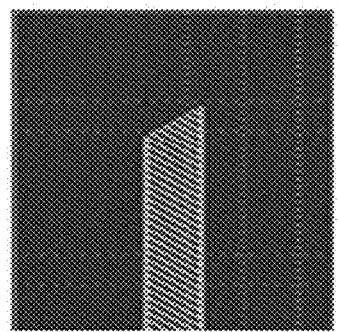
Figure 11:
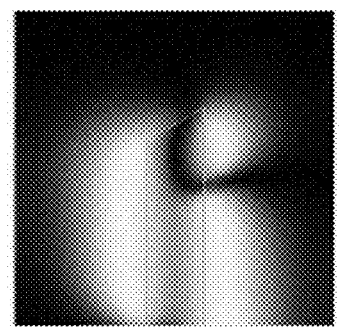
Figure 11:
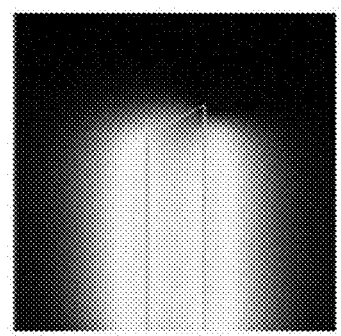
Figure 12:
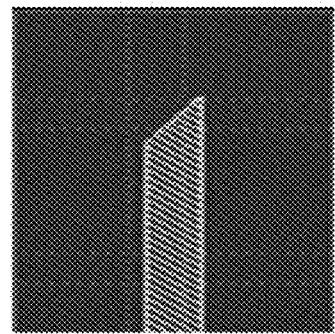
Figure 12:
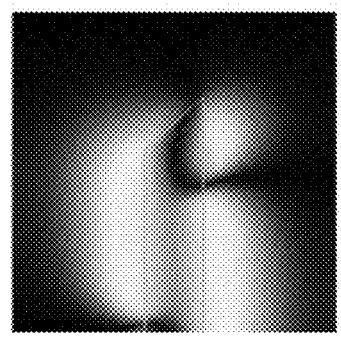
Figure 12:
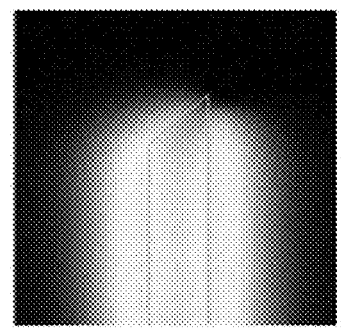
Figure 13:
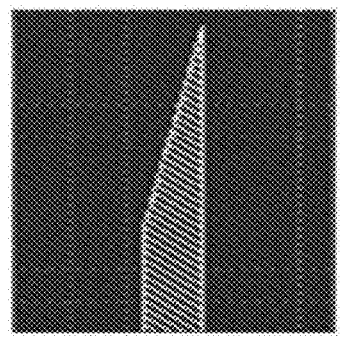
Figure 13:
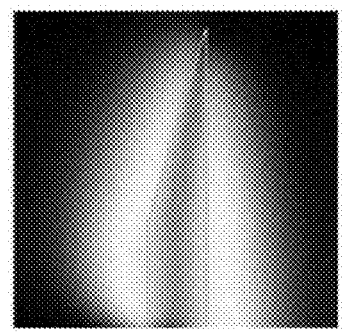
Figure 13:
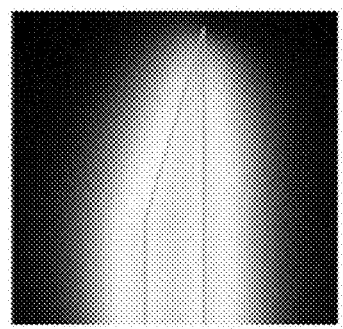

Referring to FIG. 9, when the connection portion between the first side portion S1 and the second side portion S2 is formed as the oblique portion O and the first angle (θ) between the extending line M of the first side portion S1 and the oblique portion O is about 80 degrees, the region where the transmittance is deteriorated by the irregular movement of the liquid crystal molecules on the end portion of the branch electrode may be observed.

However, referring to FIG. 10 to FIG. 13, when the connection portion for connecting the first side portion S1 and the second side portion S2 being formed as the oblique portion O and the first angle (θ) between the extending line M of the first side portion S1 and the oblique portion O is less than about 70 degrees, for example, about 60 degrees, about 45 degrees, about 30 degrees, and about 10 degrees, the region where the transmittance is deteriorated by the irregular movement of the liquid crystal molecules on the end portion of the branch electrode is substantially reduced, and thereby the transmittance deterioration of the liquid crystal display may be effectively prevented.

As described above, according to exemplary embodiments of the liquid crystal display, according to the invention, the end portion of the branch electrode of the field generating electrode is configured to include the first side portion S1 and the second side portion S2, and the oblique portion O that connects the first side portion S1 and the second side portion S2, in which the first angle (θ) between the extending line M of the first side portion S1 and the oblique portion O is less than about 70 degrees, the transmittance deterioration of the liquid crystal display, which may be generated on the end portion of the branch electrode, is substantially reduced or effectively prevented.

While the invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A liquid crystal display comprising:
 a first substrate;
 a gate line disposed on the first substrate;
 a data line disposed on the first substrate;
 a passivation layer disposed on the gate line and the data line; and
 a first electrode disposed on the passivation layer;
 a second electrode disposed on the passivation layer; and
 a first insulating layer interposed between the first and second electrodes,
 wherein
 the first and second electrodes overlap each other via the first insulating layer interposed therebetween,
 the second electrode comprises a plurality of branch electrodes, and
 an end portion of the branch electrodes comprises:
  a first side portion extending substantially parallel to the data line;
  a second side portion extending substantially parallel to the data line and opposite to the first side portion; and
  an oblique portion which connects the first side portion and the second side portion to each other and forms a first angle, which is less than about 90 degrees, with an extending line of the first side portion.

2. The liquid crystal display of claim 1, wherein the end portion of the branch electrodes further comprises a curved portion disposed between the first side portion and the second side portion.

3. The liquid crystal display of claim 2, wherein the first angle is less than about 70 degrees.

4. The liquid crystal display of claim 3, further comprising:
 a light blocking member disposed to surround the branch electrodes,
 wherein the first angle satisfies the following inequation:

$$90 - \tan^{-1}\left(\frac{b}{a}\right) \leq \theta \leq 70°,$$

wherein 'a' denotes a width of the branch electrodes, and 'b' denotes a maximum interval between an end of the first side portion of the branch electrodes and a portion of the light blocking member adjacent thereto.

5. The liquid crystal display of claim 4, wherein the first electrode has a planar shape of a plate type, and the branch electrodes of the second electrode overlap the first electrode.

6. The liquid crystal display of claim 5, further comprising:
a second substrate disposed opposite to the first substrate;
a first alignment layer disposed on the first substrate;
a second alignment layer disposed on the second substrate; and
a liquid crystal layer disposed between the first substrate and the second substrate and comprising a plurality of liquid crystal molecules,
wherein
the liquid crystal molecules have positive dielectric anisotropy or a negative dielectric anisotropy, and
the first alignment layer and the second alignment layer are aligned in a predetermined direction such that liquid crystal molecules adjacent to the first alignment layer and the second alignment layer have a pretilt in a direction forming a second angle with the gate line or an angle acquired by subtracting the second angle from 90 degrees with the gate line.

7. The liquid crystal display of claim 6, wherein
an angle between the oblique portion of the end portion of the branch electrodes and a pretilt direction has a value of a sum of the first angle and the second angle or a value acquired by subtracting the sum of the first angle and the second angle from 90 degrees.

8. The liquid crystal display of claim 1, wherein
the first angle is less than about 70 degrees.

9. The liquid crystal display of claim 8, further comprising:
a light blocking member disposed to surround the branch electrodes,
wherein the first angle satisfies the following inequation:

$$90 - \tan^{-1}\left(\frac{b}{a}\right) \le \theta \le 70°,$$

wherein 'a' denotes a width of the branch electrode, and 'b' denotes a maximum interval between an end of the first side portion of the branch electrodes and a portion of the light blocking member adjacent thereto.

10. The liquid crystal display of claim 9, wherein
the first electrode has a planar shape of a plate type, and
the branch electrodes of the second electrode overlap the first electrode.

11. The liquid crystal display of claim 10, further comprising:
a second substrate disposed opposite to the first substrate;
a first alignment layer disposed on the first substrate;
a second alignment layer disposed on the second substrate; and
a liquid crystal layer disposed between the first substrate and the second substrate and comprising a plurality of liquid crystal molecules,
wherein
the liquid crystal molecules have positive dielectric anisotropy or negative dielectric anisotropy, and
the first alignment layer and the second alignment layer are aligned in a predetermined direction such that liquid crystal molecules adjacent to the first alignment layer and the second alignment layer have a pretilt in a direction forming a second angle with the gate line or an angle acquired by subtracting the second angle from 90 degrees with the gate line.

12. The liquid crystal display of claim 11, wherein
an angle between the oblique portion of the branch electrodes and a pretilt direction has a value of a sum of the first angle and the second angle or a value acquired by subtracting the sum of the first angle and the second angle from 90 degrees.

13. The liquid crystal display of claim 1, further comprising:
a second substrate disposed opposite to the first substrate;
a first alignment layer disposed on the first substrate;
a second alignment layer disposed on the second substrate; and
a liquid crystal layer disposed between the first substrate and the second substrate and comprising a plurality of liquid crystal molecules,
wherein
the liquid crystal molecules have positive dielectric anisotropy or negative dielectric anisotropy, and
the first alignment layer and the second alignment layer are aligned in a predetermined direction such that liquid crystal molecules adjacent to the first alignment layer and the second alignment layer have a pretilt in a direction forming a second angle with the gate line or an angle acquired by subtracting the second angle from 90 degrees with the gate line.

14. The liquid crystal display of claim 13, wherein
an angle between the oblique portion of the branch electrode and a pretilt direction has a value of a sum of the first angle and the second angle or a value acquired by subtracting the sum of the first angle and the second angle from 90 degrees.

* * * * *